Nov. 13, 1962 H. L. IMELMANN 3,064,063

THERMOELECTRIC GENERATOR

Filed Nov. 5, 1959 2 Sheets-Sheet 1

INVENTOR.
HENRY L. IMELMANN
BY Mason, Kolehmainen, Rathburn and Wyss.
ATTORNEYS.

INVENTOR.
HENRY L. IMELMANN
BY
Mason, Kolehmainen, Rathburn and Wyss
ATTORNEYS.

United States Patent Office 3,064,063

Patented Nov. 13, 1962

3,064,063
THERMOELECTRIC GENERATOR

Henry L. Imelmann, Arlington Heights, Ill., assignor to Thermo Power, Inc., Franklin Park, Ill., a corporation of Delaware Filed Nov. 5, 1959, Ser. No. 851,123
4 Claims. (Cl. 136—4)

The present invention relates to thermoelectric generators, and more particularly to a simple and compact apparatus for converting heat energy directly to electrical energy.

The thermoelectric phenomenon was discovered more than one hundred years ago. From the standpoint of producing electrical energy of any magnitude devices employing this phenomenon, until recently, have been more of a curiosity than a practicality. During the last decade there has been a tremendous amount of research on the development of a thermoelectric generator which is practical and efficient as a source of electrical energy. Obviously, any arrangement which permits the conversion of heat directly to electricity would be a very desirable arrangement and the research facilities of many organizations have been directed toward solving this problem. Such thermoelectric generators have comprised forming a junction between dissimilar elements which exhibit thermoelectric properties and heating the junction with the resultant flow of electric current in a circuit connected to the junction. Extensive research has been carried on to find materials which will produce substantially higher voltages by the thermoelectric effect than have heretofore been available, and the trend has been in the direction of investigating the so-called semiconductors.

It is true that with the use of some of the more recently discovered thermoelectric elements higher voltages are obtainable but unfortunately the electrical resistance of such elements is generally so high as to offset this increased voltage. I have discovered that a principal problem in connection with thermoelectric generators is that of heating the junctions in an efficient manner and this is tied up very much with the mass of the material defining the hot junction. If the thermoelectric elements comprise material of a relatively large cross section at the junction, in other words a large mass, then the heating problem becomes very difficult and, in fact, if a relatively large mass is involved it becomes practically impossible to heat the junction to a desired temperature.

I have found that to provide a satisfactory thermocouple it is important to accomplish two things. First, it is important to reduce the resistance of the thermocouple to a minimum so that a substantial current flow can be obtained and, secondly, it is important to minimize the mass of material involved in the hot junction. Obviously, these two criteria are somewhat in opposition to each other, in that decreasing the resistance somewhat implies increasing the mass whereas decreasing the mass implies increasing the resistance. Furthermore, it is essential that the mass of the hot junction be reduced to such an extent that it is sensitive to the elevated temperature of ordinary combustion. I have furthermore discovered that any ordinary flame produces more heat than can be absorbed by one thermocouple as constructed heretofore and it would be desirable to provide an arrangement where the absorption of heat from a flame is greatly increased.

Accordingly, it is an object of the present invention to provide a new and improved thermoelectric generator.

It is another object of the present invention to provide a thermoelectric generator which absorbs heat more efficiently than arrangements heretofore employed.

Still another object of the present invention resides in the provision of a thermoelectric generator in which relative movement between the heat source and the junctions defining the thermoelectric generator occur so as to utilize more efficiently the heat source for heating the junctions.

Further objects and advantages of the present invention will become apparent as the following description proceeds and the features of novelty which characterize the invention will be pointed out with particularity in the claims annexed to and forming a part of this specification.

For a better understanding of the present invention reference may be had to the accompanying drawings in which.

Figures 1, 3:
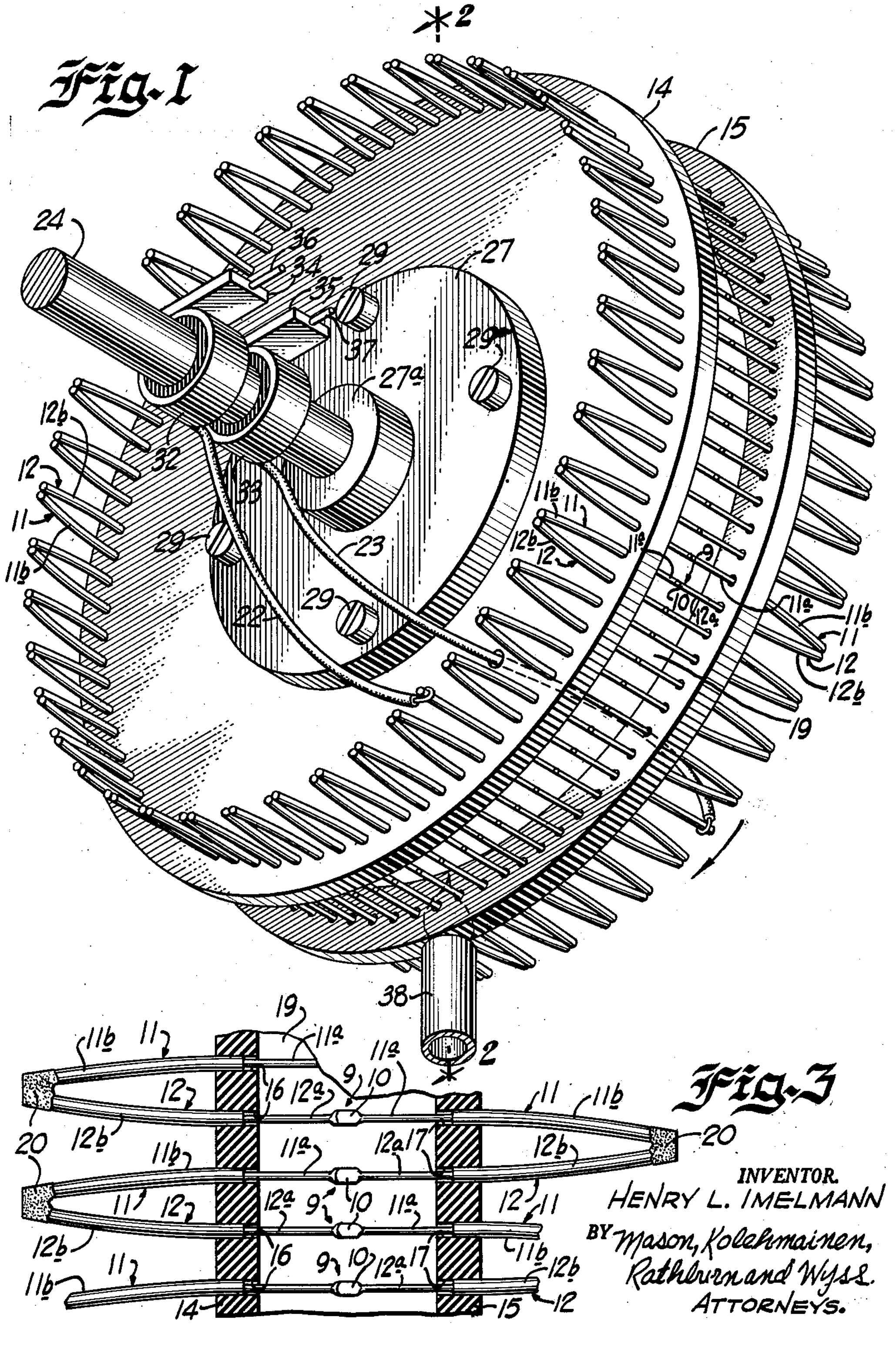
FIG. 1 is a perspective view of a thermoelectric generator embodying the present invention with certain portions thereof removed more clearly to illustrate the same.
FIG. 3 is an enlarged sectional view taken on line 3—3 of FIG. 2 assuming that FIG. 2 shows the complete structure.
Figures 2, 4:
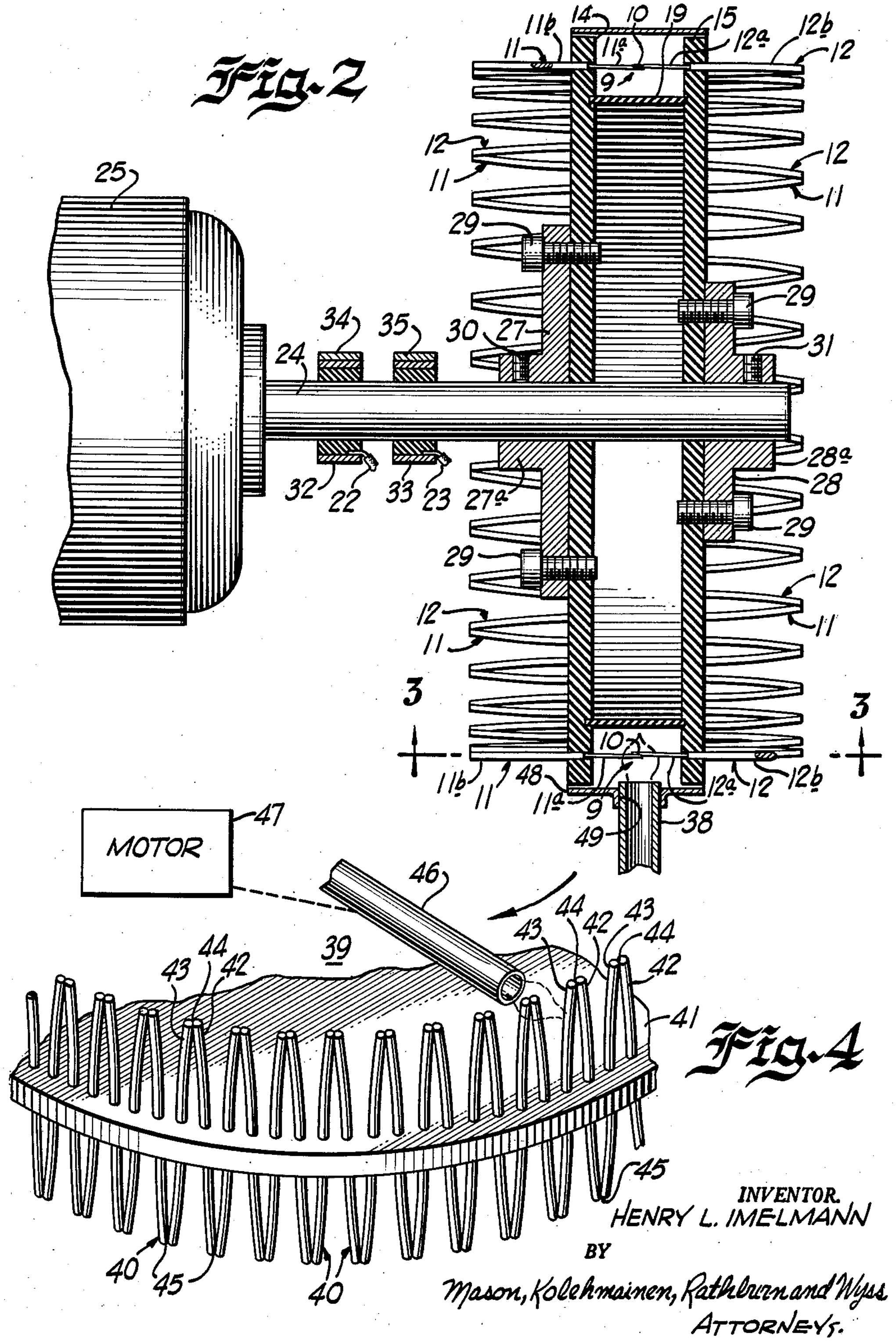
FIG. 2 is a sectional view taken substantially along line 2—2 of FIG. 1 assuming that FIG. 1 shows the complete structure and further shows additional means connected to the apparatus of FIG. 1.
FIG. 4 is a fragmentary view illustrating a modification of the present invention.

Briefly, the present invention is concerned with the discovery that greatly increased efficiency is obtainable in a thermoelectric generator where relative movement between the heat source and the junctions is provided, such movement either involving movement of the junctions to be heated or movement of the heat source, as the case may be. In either case, the same heat source can effectively heat a large number of junctions making a greatly increased power output possible. Referring now to FIGS. 1 to 3 of the drawings, there are provided a plurality of thermocouples generally designated at 9, each defining a hot junction 10 between elements of two different materials designated as 11 and 12. I prefer to refer to each thermocouple 9 comprising the junction and the elements 11 and 12 defining the same by the coined expression "thermotron" which I define as a thermocouple whose hot junction mass has been so reduced that it is very sensitive to the elevated temperature of ordinary combustion and whose total electrical resistance has been so reduced that it will produce a substantial current when heated.

The materials from which the elements 11 and 12 are constructed may comprise any pair of materials which exhibit a thermoelectric effect. Preferably, however, the materials comprise as the negative element constantan and as the positive element a nickel molybdenum alloy comprising 91% nickel and 9% molybdenum. These elements are disclosed and claimed in my copending application, Serial No. 829,644, filed July 27, 1959. In order that the mass of the hot junction 10 may be sufficiently small and yet to keep the resistance of each unit 9 low, each of the elements 11 and 12 is illustrated as comprising two portions as best shown in FIG. 3 of the drawings, a first portion **11*a* or 12*a*, as the case may be, of reduced cross section adjacent the junctions 10 and a second portion 11*b* or 12*b*, as the case may be, remote from the junctions 10. In one device built in accordance with the present invention the elements 11 and 12 were one and one-half inches in length, the portions 11*a* and 12*a* were one thirty-second of an inch in diameter, and the portions 11*b* and 12*b*** were one sixteenth of an inch in diameter.

For the purpose of supporting a plurality of units 9 there is illustrated in FIG. 1 of the drawings a pair of insulated supporting plates 14 and 15 which are disposed in spaced parallel relationship. Preferably, these plates are formed of good electrical insulating materials which are also resistant to temperatures which may be as high as 2000° F. The thermotrons or thermocouples 9 each comprising an element 11 and an element 12 with a junction 10 are then mounted in aligned openings 16 and 17 in the supports 14 and 15, respectively, with the junctions 10 disposed midway between the supports. As illustrated in the drawings, the supports 14 and 15 are in the form of circular disks and the thermotrons 9 are arranged in equally spaced relationship adjacent the periphery thereof, as clearly shown in FIGS. 1 and 2 of the drawings. Although only a single row of thermotrons 9 is illustrated as being supported by the supports 14 and 15, obviously additional rows may be mounted thereon. In a device built in accordance with the present invention the supports 14 and 15 were of the order of six and one-half inches in diameter and one hundred thermotrons 9 were supported in the manner shown in FIG. 1 of the drawings.

Preferably, the openings 16 and 17 are of a size to just receive the enlarged portions 11*b* and 12*b* of the elements 11 and 12 and it will be appreciated that the thermotrons 9 are alternatively arranged for a purpose which will be described hereinafter. By that is meant, as is clearly shown in FIG. 3 of the drawings, that if the element 12 is supported in opening 16 in support 14 then, of course, the element 11 will be supported in the opening 17 in the support 15. In the immediately adjacent openings, however, the reverse is true in that the element 11 is supported in the opening 16 in the plate 14 whereas the element 12 is supported in the opening 17 in the support 15. Thus, the thermotrons 9 are alternated successively in going around the supports 15 and 16.

During the assembly operation, the junctions 10 are preferably formed and assembled with the plates 14 and 15 in a manner such that the junctions 10 are disposed between the plates. Preferably also, an insulating annular barrier 19 is suitably supported between the plates 14 and 15, as best shown in FIG. 2 of the drawings. The adjacent faces of the supports 14 and 15 are provided with an annular groove to receive the barrier 19, the purpose of which will become apparent as the following description proceeds. This barrier should be formed of heat resistant material and should be similar to the material from which the plates 14 and 15 are made.

Each thermotron 9 when the junction 10 is heated will, if connected in an electric circuit, produce a relatively low voltage by the phenomenon of thermoelectricity. In order that this voltage may be increased to a usable value, the thermotrons 9 are connected in series and this is accomplished as best shown in FIG. 3 of the drawings by electrically joining the ends of the thermotrons extending beyond the remote faces of the plates 14 and 15. These junctions are designated by the reference numeral 20 in the drawings and are sometimes referred to as the cold junctions to distinguish them from the hot junctions 10. The ends of the serially connected thermotrons 9, as best shown in FIG. 1 of the drawings, are electrically connected to terminal conductors 22 and 23.

In accordance with the present invention the serially connected thermotrons supported by the plates 14 and 15 are adapted to be mounted for rotation upon a suitable shaft 24 drivingly connected to a prime mover such as an electric motor 25. To this end, the plates 14 and 15 are provided with central openings to accommodate the shaft 24 and suitable flanged plates 27 and 28 are secured to the plates 14 and 15, respectively, as by fastening means 29. These plates 27 and 28 are provided with hub portions 27*a* and 28*a*, respectively, as well as aligned openings to accommodate the shaft 24. Suitable set screws 30 and 31 then drivingly relate the shaft 24 with the support means for the thermotrons each comprising elements 11 and 12. In order that the output of the thermoelectric generator of the present invention may be connected to a suitable load, the conductors 22 and 23 are each connected to suitable slip rings 32 and 33 supported in insulated relationship with respect to the shaft 24, and brushes 34 and 35 then engaging the slip rings 32 and 33 may be electrically connected by conductors 36 and 37 with a suitable load circuit, not shown.

For the purpose of heating the junctions 10 there is provided a source of heat generally designated at 38 which may be any source of heat produced by ordinary combustion such as a gas flame or the like and this flame is disposed adjacent the junctions 10, as best shown in FIG. 2 of the drawings, so that upon rotation of the shaft 24 the junctions 10 will be successively heated by the source 38. In this way very efficient use of the heat is accomplished and I have discovered that the same heat source 38 required to heat a single junction 10 can be used to substantially heat more than one hundred junctions merely by mounting them in the manner described and producing relative movement between the heat source and the junctions. The barrier 19 with the plates 14 and 15 confines the heat from the source 38 to the immediate vicinity of the junctions. Preferably there is provided a stationary cover 48 for substantially closing the annular space within which the junctions 10 are disposed, as clearly shown in FIG. 2 of the drawings. The cover 48 is provided with an opening 49 through which the heat source 38 may extend. The cover 48 is spaced slightly from plates 14 and 15 so as not to interfere with their rotation but sufficiently close to confine the heat to the junctions 10.

The low mass of the junctions is very important in that it results in almost instantaneous heating of the junctions to the desired temperature and by periodically heating each of the junctions in succession a substantially constant temperature of these junctions may be maintained. With the very efficient use of the heat source, the power necessary to produce relative motion between the heat source and the junctions is insignificant and a very effective thermoelectric generator is thereby produced.

It should be understood that instead of moving the thermotrons 9 with the heat source in a stationary position, one might equally well move the heat source which would eliminate the necessity of slip rings and brushes. In FIG. 4 there is illustrated a thermoelectric generator embodying the present invention generally designated by the reference numeral 39 wherein a plurality of thermotrons 40 are supported by an insulated support 41. These thermotrons are merely schematically illustrated as each comprising elements 42 and 43 alternately arranged in spaced relationship with adjacent ends joined to form junctions 44 which might be referred to as hot junctions and at the opposite end junctions 45 which might be referred to as cold junctions. The elements 42 and 43 might comprise the same materials as in FIGS. 1 to 3 of the drawings. A suitable heat source designated at 46 is disposed to heat the hot junctions 44, and motive means designated at 47 causes this source of heat to move in a manner successively to heat the hot junctions with sufficient frequency to maintain them at a high temperature. It will be understood that the heat source 46 may be pivotally mounted about a center in which case the hot junctions would be required to be disposed in a circular pattern. It will be appreciated, however, that the heat source might be mounted on an endless belt of some sort so that the hot junctions might be disposed along a linear path. The important feature, however, is that relative movement is produced between the heat source and the junctions thereby greatly to increase the efficiency of the generator.

In view of the detailed description included above the operation of the thermoelectric generator of the present invention will be readily understood by those skilled in the art.

While there have been illustrated and described particular embodiments of the present invention, it will be appreciated that numerous changes and modifications are likely to occur to those skilled in the art, and it is intended in the appended claims to cover all those changes and modifications which fall within the true spirit and scope of the present invention.

What is claimed as new and desired to be secured by Letters Patent of the United States is:

1. A thermoelectric generator comprising a plurality of thermocouples defined between a different pair of dissimilar materials whose mass has been so reduced that its hot junctions are sensitive to the elevated temperature of ordinary combustion and whose electrical resistance has been so reduced that they will produce a substantial current when heated, means for supporting said thermocouples in fixed spaced relationship relative to each other, circuit means for connecting said junctions in an electric circuit of alternate hot and cold junctions, a source of heat for heating only the hot junctions of said thermocouples, and means for producing relative movement between said source and said junctions whereby said hot junctions are periodically and successively heated to maintain said hot junctions at a substantially constant temperature.

2. A thermoelectric generator comprising a plurality of junctions defined between a different pair of elements of dissimilar materials, each element having a first portion of reduced cross section adjacent the junction and a second portion remote from the junction, means for supporting said junctions in fixed spaced relationship relative to each other, means for connecting said junctions in an electrical circuit of alternate hot and cold junctions, a source of heat for heating only said hot junctions, and means for producing relative movement between said source and said junctions whereby said hot junctions are periodically and successively heated to maintain said hot junctions at a substantially constant temperature.

3. A thermoelectric generator comprising a pair of spaced circular insulating supports, a plurality of pairs of elements of dissimilar material, each element of said pairs having a first portion of reduced cross section forming a hot junction with the other element of said pairs and a second portion remote from said hot junction, said first portions being mounted between said supports near the periphery thereof in fixed spaced relationship relative to each other, circuit means for connecting said junctions in an electric circuit of alternate hot and cold junctions, a source of heat for heating only said hot junctions, and means for rotating said supports relative to said source whereby said junctions are periodically and successively heated to maintain said hot junctions at a substantially constant temperature.

4. The thermoelectric generator of claim 3 wherein an annular heat barrier is disposed between said supports near the periphery thereof but closer to the center of said supports than said hot junctions.

References Cited in the file of this patent

UNITED STATES PATENTS

| | | |
|---|---|---|
| 434,587 | Edison | Aug. 19, 1890 |
| 2,031,966 | Mathias | Feb. 25, 1936 |
| 2,480,404 | Findley et al. | Aug. 30, 1949 |
| 2,504,764 | Vollrath | Apr. 18, 1950 |
| 2,516,719 | Pack | July 25, 1950 |
| 2,671,818 | Turck | Mar. 9, 1954 |

FOREIGN PATENTS

| | | |
|---|---|---|
| 83,170 | Germany | Oct. 8, 1895 |
| 234,747 | Germany | May 29, 1910 |